United States Patent [19]
Jung

[11] Patent Number: 5,382,920
[45] Date of Patent: Jan. 17, 1995

[54] CIRCUIT ARRANGEMENT FOR AN OPTICAL RECEIVER

[75] Inventor: Reinhold Jung, Böblingen, Germany

[73] Assignee: Alcatel N.V., Amsterdam, Netherlands

[21] Appl. No.: 46,768

[22] Filed: Apr. 13, 1993

[30] Foreign Application Priority Data

Apr. 18, 1992 [DE] Germany .................. 4212933

[51] Int. Cl.⁶ .................................... H03F 3/08
[52] U.S. Cl. ........................ 330/308; 250/214 A; 330/110
[58] Field of Search ............ 330/59, 110, 308; 250/214 A, 214 LA; 359/189

[56] References Cited

U.S. PATENT DOCUMENTS

| | | | |
|---|---|---|---|
| 3,999,060 | 12/1976 | Skagerlund | 330/110 |
| 4,608,542 | 8/1986 | Siegel | 330/308 |
| 4,939,475 | 7/1990 | Prasse | 330/308 |

OTHER PUBLICATIONS

"Lichtwellenleiter-Technik", Pflaum Verlag Munchen, 1986, pp. 282-289 by Dieter Lutzke.

"A Wide-Band Low-Noise Monolithic Transimpedance Amplifier", IEEE Journal of Solid-State Circuits, vol. SC-21, No. 4, Aug. 1986.

*Primary Examiner*—Steven Mottola
*Assistant Examiner*—Tiep H. Nguyen
*Attorney, Agent, or Firm*—Ware, Fressola, Van der Sluys & Adolphson

[57] ABSTRACT

Optical receivers with a photodiode (PD) and a transimpedance amplifier are optimized for signals with a particular transmission rate. A circuit is provided whereby the optical receiver can be adapted to different transmission rates. To attain this object, the feedback resistor of the transimpedance amplifier is divided into at least two resistors ($R_{F1}$, $R_{F2}$) connected in series. According to the transmission rate, the respective optimum resistance value is switched into the negative-feedback path with the aid of a control circuit. This makes it possible to operate such a universal optical receiver in a broadband subscriber interface both at a transmission rate of 150 Mb/s and at a transmission rate of 600 Mb/s, for example.

12 Claims, 4 Drawing Sheets

CIRCUIT ARRANGEMENT FOR AN OPTICAL RECEIVER

BACKGROUND OF THE INVENTION

1. Technical Field

The present invention relates to a circuit arrangement for an optical receiver used as an optical-to-electrical transducer in optical communication systems.

2. Background of the Invention

If great band-width and high dynamic range are recruited, a transimpedance amplifier is frequently used as the preamplifier, see Dieter Lutzke, "Lichtwellenleiter-Technik", Pflaum Verlag M/e,uml/u/ chen, 1986, pp. 282 to 289. FIG. 1 shows a generally known equivalent circuit of an optical receiver. The photodiode PD is shown as a current source $I_{ph}$ shunted by a capacitance $C_D$, and the succeeding transimpedance amplifier TIV consists of an operational amplifier V with a feedback resistance $R_F$, an input resistance $R_V$, and an input capacitance $C_V$. The photodiode PD delivers a photocurrent $I_{ph}$ which, to a first approximation, is proportional to the received light power. The operational amplifier, whose output is fed back through the feedback resistance $R_F$, converts the photocurrent $I_{ph}$ into an output voltage $U_a$. Assuming a high gain v, the corresponding current-voltage transfer function of the transimpedance amplifier is $$H(\omega) = \frac{U_a(\omega)}{I_{ph}(\omega)} = -\frac{R_F}{1 + j\omega \frac{R_F(C_D + C_V)}{v}}$$

follows that the 3-dB cutoff frequency is $$f_g = \frac{v}{2\pi R_F(C_D + C_V)}$$

The feedback resistance $R_F$ is thus fixed by specifying a desired bandwidth. However, the resistance value influences the noise characteristic and, hence, the receiver sensitivity. If the receiver sensitivity is to be high, the feedback resistance $R_F$ must be made as large as possible. This reduces the noise contribution of the feedback resistance $R_F$, but also the bandwidth of the optical receiver.

In prior art solutions, the feedback resistance value is chosen in accordance with the maximum required transmission rate in an optical communication system, see R. G. Meyer, R. A. Blauschild, "A Wide-Band Low-Noise Monolithic Transimpedance Amplifier", IEEE Journal of Solid-State Circuits, Vol. SC-21, No. 4, Aug. 1986. If a receiver is used at a lower transmission rate, the mismatched feedback resistance will cause a loss of receiver sensitivity.

SUMMARY OF THE INVENTION

It is the object of the invention to provide a circuit arrangement for an optical receiver which is universally applicable at different transmission rates and suitable for monolithic integration.

This object is attained by providing the circuit arrangement wherein the feedback resistor is connected as a series combination of two resistors between the input and output of a transimpedance amplifier, and that between the junction of the first and second amplifier stages and the junction of the two feedback resistors, an amplifier is inserted which has essentially the same transfer function as the second amplifier stare and includes means for switching the amplifier to an active state or a blocked state. By dividing the feedback resistor into two resistors connected in series, it becomes possible to match the value of the effective feedback resistance to the respective transmission rate. A large feedback resistance causes a low cutoff frequency or small bandwidth, and a small feedback resistance causes a high cutoff frequency or wide bandwidth. It is also possible to divide the feedback resistor into more than two resistors and thus optimize the transimpedance amplifier for the transmission of different bit rates.

The effect of the circuit arrangement is based on the fact that the first amplifier stage is followed by two equally acting amplifier stages having respective inputs together having a common input mode, one of them being controllable. The outputs of the two amplifier stages are coupled to the terminals of one of the two feedback resistors, so that if the amplifiers have the same response, no voltage difference will appear across this resistor, which thus has no effect on the negative feedback. If the amplifier stage having its output coupled to the junction of the two resistors is blocked by the control voltage, the whole feedback resistance will become effective.

Thus, an optical receiver suitable for monolithic integration is provided which can be operated, for example, is a broadband subscriber interface both at a transmission rate of 150 Mb/s and at a transmission rate of 600 Mb/s.

BRIEF DESCRIPTION OF THE DRAWINGS

The invention will become more apparent from the following description of a specific embodiment taken in conjunction with the accompanying drawings, in which.

BEST MODE FOR CARRYING OUT THE INVENTION

Figure 1:
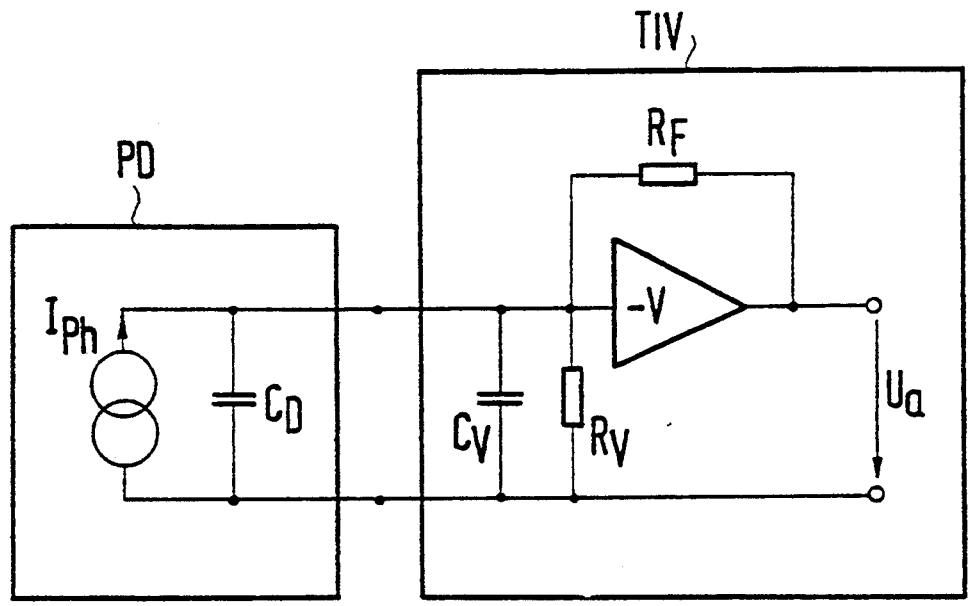
FIG. 1 shows the equivalent circuit of a prior art optical receiver.
Figure 2:
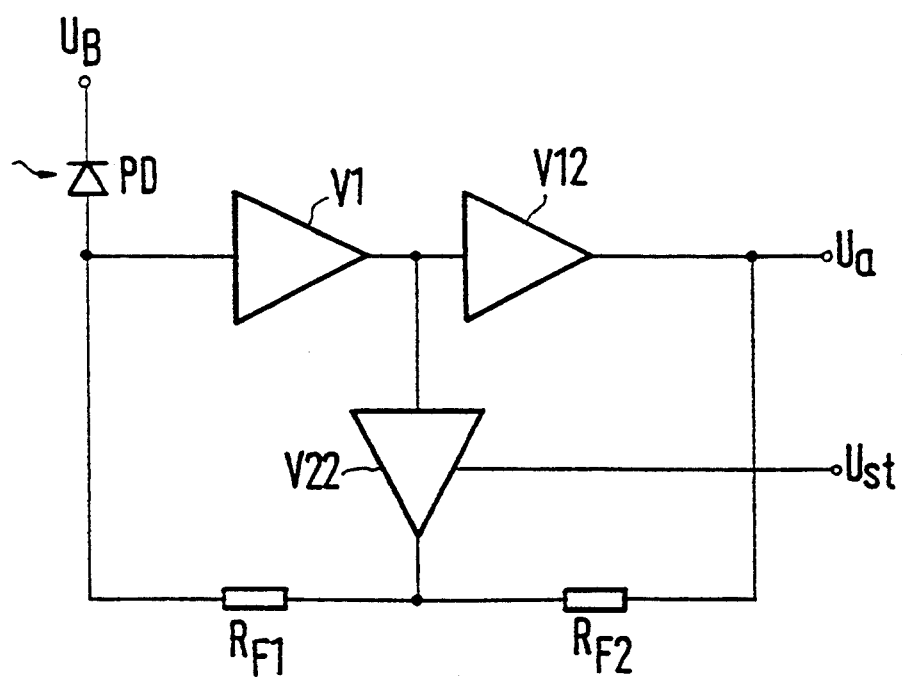
FIG. 2 is a block diagram of the circuit arrangement in accordance with the invention.
Figure 3:
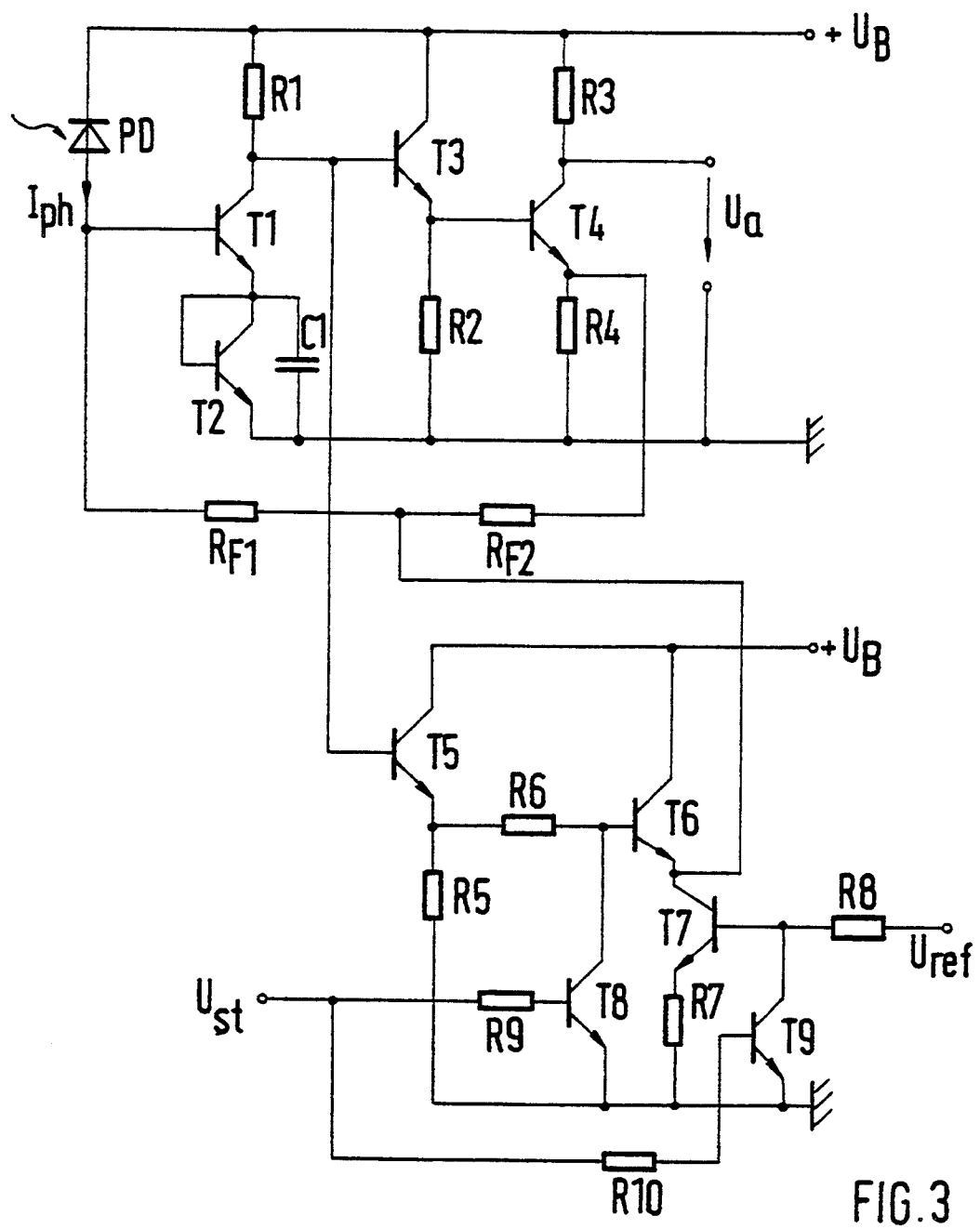
FIG. 3 is a schematic diagram of the circuit arrangement in accordance with the invention.

As shown in FIG. 2, the circuit arrangement for an optical receiver consists of a photodiode PD, an amplifier made up of two amplifier stages V1, V12, an additional amplifier V22, whose operation is determined by a control voltage $U_{st}$, and a feedback resistor implemented as a series combination of two resistors $R_{F1}$, $R_{F2}$. A possible technical realization is shown in FIG. 3. The first amplifier stage V1 includes a first transistor T1 as an active element, and the second amplifier stage V12 contains two transistor stages with second and third transistors T3, T4. A second signal path is designed in a similar manner with two transistors T5, T6 as the additional amplifier V22. A supplementary circuit consisting of two transistor switches with transistors T8, T9 makes it possible to control this second signal path. Also provided is a current source which is controlled by a reference voltage $U_{ref}$ and includes a transistor T7.

FIG. 3 shows a transimpedance amplifier in detail in the upper side thereof, and shows the control circuit in detail in the lower side thereof.

The operation of the circuit arrangement is as follows. If the control voltage $U_{st}$ is greater than the base-emitter voltage $U_{BE}$ of the two transistors T8, T9 of the supplementary circuit, the transistors T8, T9 will be turned on until the collector-emitter saturation voltage $U_{CEsat}$ is reached. As a result, the second signal path is shunted to ground through a resistor R6 and the transistor T8. At the same time, the reference voltage $U_{ref}$, which generates a constant current through the transistor T6 by means of the circuit consisting of transistor T7 and resistor R7, is also shunted to ground through a resistor R8 and the transistor T9. The transistor T6 in the output of the second signal path is thus currentless, and a reverse voltage of about 2 $U_{BE}$ is applied to its base-emitter diode. As a result, only the relatively low depletion-layer capacitance of the base-emitter diode of the transistor T6 is effective at the junction of the two resistors $R_{F1}$, $R_{F2}$, but this capacitance has practically no influence on the transfer function and the noise of the transimpedance amplifier. The transimpedance amplifier now operates with an effective feedback resistance equal to the sum of the values of the two resistors $R_{F1}$, $R_{F2}$.

If the control voltage is very much smaller than the base-emitter voltage $U_{BE}$ of the transistors T8, T9 of the supplementary circuit, the transistors T8, T9 are turned off and the transistor T6 in the output of the second signal path is traversed by a constant current. The signal taken from the collector of the transistor T1 of the first amplifier stage is fed through the second signal path, containing the transistors T5, T6 and the first resistor $R_{F1}$ of the negative-feedback loop, back to the input of the transimpedance amplifier. Since the same signal is present at the emitters of the output transistors T4, T6 in the first and second signal paths, and the second resistor $R_{F2}$ is connected between these two transistors, the negative feedback through the second resistor $R_{F2}$ is ineffective. The transimpedance amplifier now operates with the first resistor $R_{F1}$ as a feedback resistor.

Figure 4:
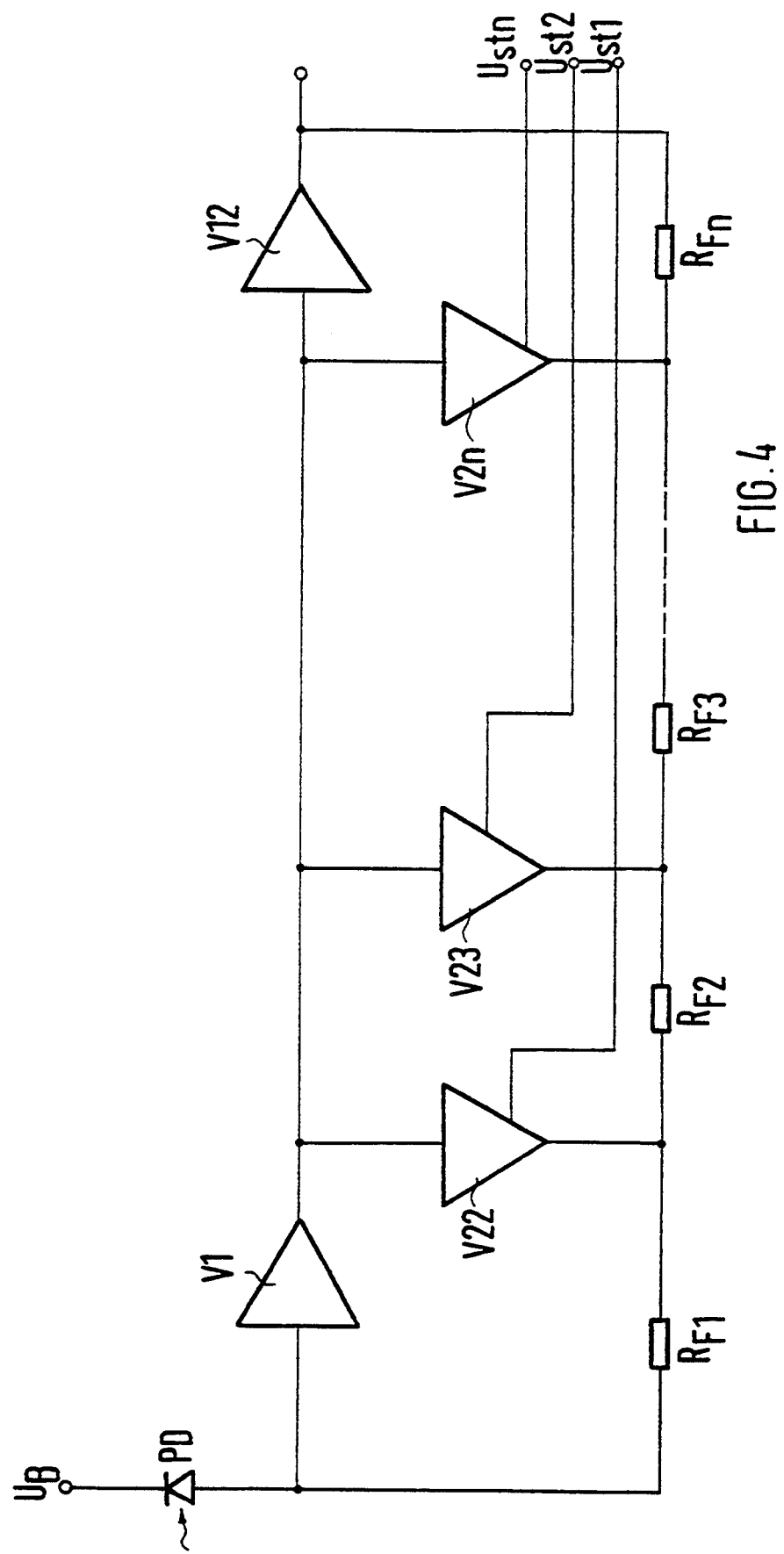
FIG. 4 is a block diagram of the circuit arrangement in accordance with the invention if the feedback resistor is divided into more than two resistors.

FIG. 4 shows an embodiment of the optical receiver where the negative-feedback resistors includes two or more additional resistors ($R_{F3}$, ..., $R_{Fn}$) connected in series between the input and output of the transimpedance amplifier means (TIV) and the controllable amplifier means (V22) includes two or more additional controllable amplifiers (V23, ..., V2n).

For example, the negative-feedback resistor consists of a first resistor ($R_{F1}$), a second resistor ($R_{F2}$), a third resistor ($R_{F3}$), and an nth resistor ($R_{Fn}$). Compared to the circuit arrangement of FIG. 2, an amplifier (V23) associated with the third resistor ($R_{F3}$) and an amplifier (V2n) associated with the nth resistor ($R_{Fn}$) have been added. It is respectfully submitted that any person skilled in the art would appreciate that when all the amplifiers (V22, V23, V2n) are in an active state, only the first resistor ($R_{F1}$) will act as a negative-feedback resistor. If the amplifier (V22) is blocked by means of the control voltage ($U_{st1}$), the sum $R_{F1}+R_{F2}$ will act as the negative-feedback resistor. By blocking further amplifiers associated with the resistors in the negative-feedback loop by means of respective control voltages ($U_{st1}$, $U_{st2}$, ..., $U_{stn}$), the resistors can be activated. A resistance range from $R_{F1}$ to $R_{F1}+R_{F2}+R_{F3}+\ldots+R_{Fn}$ can be covered, so that optical receivers can be implemented which are optimizable for n different transmission rates.

Figure 2A:
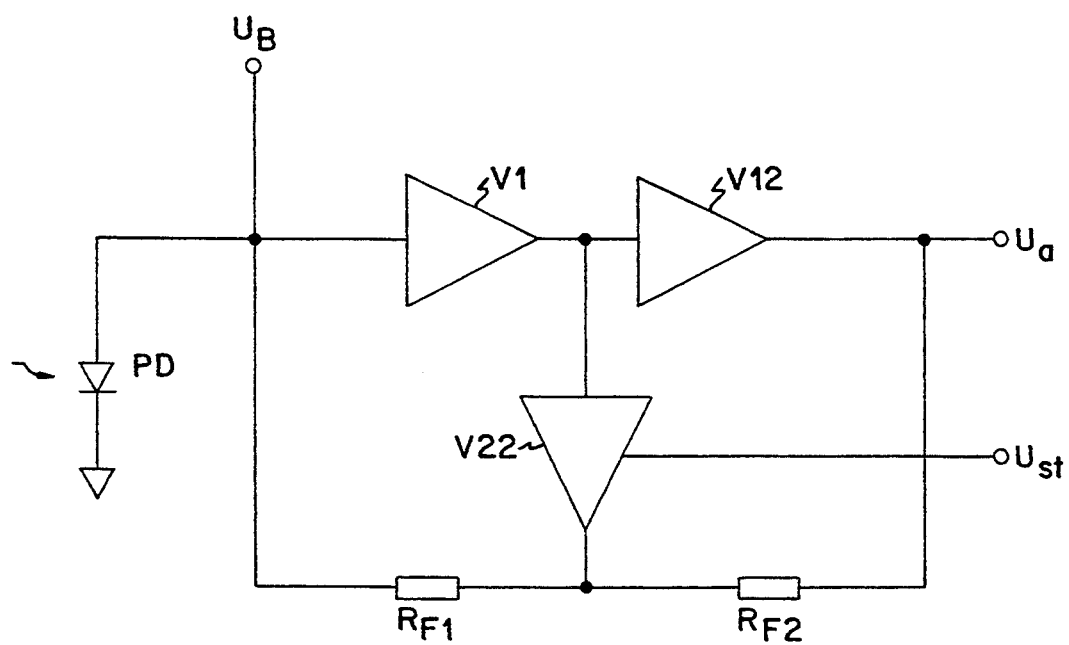
FIG. 2(a) shows an alternative embodiment to that shown in FIG. 2.

FIG. 2(a) shows an alternative embodiment of the invention similar to the embodiment in FIG. 2. In FIG. 2(a), the photodiode PD is connected between ground and an input of the transimpedance amplifier.

I claim:

1. A circuit arrangement for an optical receiver having a negative feedback path comprising a photodiode (PD) and a transimpedance amplifier (TIV), with the photodiode (PD) connected between a supply voltage source ($U_B$) and an input of the transimpedance amplifier (TIV) or between the input of the transimpedance amplifier (TIV) and ground, and the transimpedance amplifier (TIV) comprising a first amplifier stage (V1), a second amplifier stage (V12) and a negative-feedback resistor forming the negative feedback path, an input of the first amplifier stage (V1) being connected to the input of the transimpedance amplifier (TIV), and an output of the second amplifier stage (V12) being connected to an output of the transimpedance amplifier (TIV), characterized in that the negative-feedback resistor is connected as a series combination of two resistors ($R_{F1}$, $R_{F2}$) between the input and output of the transimpedance amplifier (TIV), and that between a junction of the first and second amplifier stages (V1, V12) and a junction of the two feedback resistors ($R_{F1}$, $R_{F2}$), an amplifier (V22) is connected which has essentially a same transfer function as the second amplifier stage (V12) and includes means for switching the amplifier (V22) to an active state or a blocked state.

2. A circuit arrangement as recited in claim 1, characterized in that the negative-feedback resistor is further formed by a series combination of more than two additional resistors, that with each additional resistor ($R_{F3}$, $R_{Fn}$), the transimpedance amplifier is expanded by one additional amplifier (V23, V2n) having a common input node with said amplifier (V22), and having substantially the same transfer function as the second amplifier stage (V12), that an output of each of said one additional amplifiers (V23, V2n) is connected to a terminal of one of the additional resistors ($R_{F3}$, $R_{Fn}$) which is not connected to the output of the transimpedance amplifier (TIV), and that said additional amplifiers (V23, V2n) are activated independently of each other.

3. A circuit arrangement as recited in claim 2, characterized in that the additional amplifiers (V23, V2n) are switched with respective control voltages ($U_{st2}$, $U_{stn}$) via a control circuit in such a way that in a first state, respective input voltages to the additional amplifiers (V23 ... V2n) are ineffective, due to a short circuit to ground caused by a transistor stage (T8), and that in a second state, each of the additional amplifiers (V23, V2n) has substantially the same transfer function as the second amplifier stage (V12), so that a substantially equal voltage is applied at two terminals of a respective one of said additional resistors ($R_{F3}$ ... $R_{Fn}$) connected between respective outputs of adjacent equally acting amplifiers (V23, V2n) so that said respective resistor currentless and has no effect on the negative feedback path.

4. A circuit arrangement as recited in claim 1, characterized in that the amplifier (V22) connected between the junction of the amplifier stages (V1, V12) and the junction of the resistors ($R_{F1}$, $R_{F2}$) of the negative-feedback path is switched with a control voltage ($U_{st}$) via a control circuit in such a way that in a first state, an input voltage of the amplifier is ineffective, due to a short circuit to ground caused by a transistor stage (T8), and that in a second state, the amplifier (V22) has a substantially similar transfer function as the second amplifier stage (V12), so that a substantially equal voltage is applied at two terminals of one of said feedback resistors which is ($R_{F2}$) connected between an output of the amplifier (V22) and an output of the second amplifier stage (V12), said resistor ($R_{F2}$) thus being currentless and having no effect on the negative feedback path.

5. A circuit for an optical receiver having negative feedback comprising:
  photodiode (PD) means, responsive to optical signals, for providing photodiode output signals;
  transimpedance amplifier means (TIV), responsive to the photodiode output signals, for providing corresponding electrical signals, the transimpedance amplifier means (TIV) having an input and an output and including:
    first amplifier means (V1) with an input connected to the input of the transimpedance amplifier means (TIV),
    second amplifier means (V12) with a given transfer function and with an output connected to the output of the transimpedance amplifier means (TIV), the first amplifier means (V1) being coupled to the second amplifier means (V12) at an amplifier junction,
    negative-feedback resistor means for forming said negative feedback having at least two resistors ($R_{F1}$, $R_{F2}$) connected in series between the input and output of the transimpedance amplifier means (TIV) and being coupled at a resistor junction,
    controllable amplifier means (V22) having a substantially similar transfer function as the given transfer function of the second amplifier means (V12), the controllable amplifier means (V22) being connected between the amplifier junction and the resistor junction and having means for switching between an active state or a blocked state.

6. A circuit according to claim 5, characterized in that
  the negative-feedback resistor means further includes at least two additional resistors ($R_{F3}, \ldots, R_{Fn}$) connected in series between the input and output of the transimpedance amplifier means (TIV), each adjacent pair of said two resistors ($R_{F1}$, $R_{F2}$) and said at least two additional resistors ($R_{F3}, \ldots, R_{Fn}$) is coupled at a respective resistor junction;
  the transimpedance amplifier (TIV) includes at least one additional controllable amplifier means (V23, . . . , V2n);
  each of said at least one additional controllable amplifier means (V23, . . . , V2n) has a substantially similar transfer function as said second amplifier means (V12);
  each of said at least one additional controllable amplifier means (V23, . . . , V2n) is connected between the amplifier junction and a corresponding one of the respective resistor junctions; and
  each of said at least one additional controllable amplifier means (V23, . . . , V2n) is independently activated.

7. A circuit according to claim 6, characterized in that each of said at least one additional controllable amplifier means (V23, . . . , V2n) is switched by a respective control voltage ($U_{st2}, \ldots, U_{stn}$).

8. A circuit according to claim 7, characterized in that each of said at least one additional controllable amplifier means (V23, . . . , V2n) is switched via a control circuit and has a first state, wherein an input voltage of each of said at least one additional controllable amplifier means (V23, . . . , V2n) is ineffective by a short circuit to ground caused by a transistor means (T8), and has a second state, wherein each of said at least one additional controllable amplifier means (V23, . . . , V2n) has a substantially similar transfer function as the second amplifier stage (V12), so that a substantially equal voltage is applied at both terminals of a respective resistor connected between adjacent outputs of two equally acting adjacent additional controllable amplifier means (V23, . . . , V2n), which is thus currentless and has no effect on the negative feedback.

9. A circuit according to claim 5, characterized in that the controllable amplifier means (V22) connected between the amplifier junction and the resistor junction is switched with a control voltage ($U_{st1}$).

10. A circuit according to claim 9, characterized in that the controllable amplifier means (V22) is switched via a control circuit and has a first state, wherein its input voltage is ineffective due to a short circuit to ground caused by a transistor means (T8), and has a second state, wherein the control amplifier means (V22) has a substantially similar transfer function as the second amplifier stage (V12), so that a substantially similar voltage is applied at both terminals of one of said feedback resistors which is; ($R_{F2}$) connected between the outputs of the control amplifier means (V22) and the second amplifier means (V12), said resistor ($R_{F2}$) thus being currentless and having no effect on the negative feedback.

11. A circuit according to claim 5, characterized in that the photodiode means (PD) is connected between a supply voltage source ($U_B$) and the input of the transimpedance amplifier (TIV).

12. A circuit according to claim 5, characterized in that the photodiode means (PD) is connected between the input of the transimpedance amplifier (TIV) and a ground.

* * * * *

UNITED STATES PATENT AND TRADEMARK OFFICE
CERTIFICATE OF CORRECTION

PATENT NO. : 5,382,920
DATED : January 17, 1995
INVENTOR(S) : R. Jung

It is certified that error appears in the above-indentified patent and that said Letters Patent is hereby corrected as shown below:

At column 4, line 37 (claim 2, line 4), after "resistors", please insert --($R_{F3}$, $R_{Fn}$)--; and at line 61 (claim 3, line 14), after "resistor", please insert --is--.

At column 5, line 1 (claim 4, line 6), please change "an" to --the--.

Signed and Sealed this

Thirtieth Day of May, 1995

*Attest:*

BRUCE LEHMAN

*Attesting Officer*      *Commissioner of Patents and Trademarks*